E197A XR 3,524,394

[11] 3,524,394

[72] Inventor Brian Sunners
Poughkeepsie, New York
[21] Appl. No. 594,752
[22] Filed Nov. 16, 1966
[45] Patented Aug. 18, 1970
[73] Assignee International Business Machines Corporation
Armonk, New York 10504
a Corp. of New York

[54] MONOLITHIC CIRCUIT MANUFACTURE AND PHOTORESIST EXPOSURE TECHNIQUE UTILIZED THEREIN
12 Claims, 12 Drawing Figs.

[52] U.S. Cl. 95/12, 346/107, 350/285, 355/40
[51] Int. Cl. E01c 5/08
[50] Field of Search 350/285; 95/1. 12; 346/107, 108; 355/40

[56] References Cited
UNITED STATES PATENTS
3,051,044 8/1962 McNaney 95/12UX
3,224,349 12/1965 Schumann et al 346/107X

*Primary Examiner*— John M. Horan
*Assistant Examiner*— Richard A. Wintercorn
*Attorney*—Hanifin and Jancin ABSTRACT: An apparatus for exposing the photoresist coating on a semiconductor wafer to form thereon the metallic interconnection pattern which wires up a plurality of network components to form a single monolithic integrated circuit. A light beam is transmitted through a refracting glass plate before it strikes the photoresist. Relatively large angular displacements of the glass plate provide relatively small displacements of the light beam. The angular displacements of the refracting plate are controlled by a computer which determines the configuration of the wiring interconnection pattern from test data designating which network components are acceptable for use in the pattern.

Computer controlled gimbal pivoted refracting plate for scanning

INVENTOR
BRIAN SUNNERS

BY Martin G. Raiffini
ATTORNEY

MONOLITHIC CIRCUIT MANUFACTURE AND PHOTORESIST EXPOSURE TECHNIQUE UTILIZED THEREIN

This invention relates to a technique for exposing a photoresist coating, and to the manufacture of monolithic circuits utilizing said technique.

In the manufacture of large-scale integrated circuits wherein a number of network components are formed and interconnected on a single unitary semiconductor wafer, the major problem arises from the yield. That is, a substantial portion of the network components of any wafer specimen are, in the present state of the art, inevitably defective and incapable of use. It is therefore the present practice to form the wafer with redundant network components which may be either subcircuits or individual devices. The various network components are first tested to determine which are acceptable and which are defective. An individual wiring interconnection pattern is then determined for each particular wafer so as to utilize and interconnect only those network components which are acceptable, while those components which are defective are not used in the final overall interconnected circuit.

This so-called "discretionary wiring" technique of providing an individualized wiring interconnection pattern for each wafer is, in the present state of the art, difficult, time-consuming and expensive, and it is this problem with which the present invention is primarily concerned. Prior to the advent of the present invention there were only two techniques in general use. The first technique involves the layout and fabrication of an individual photoresist exposure mask for each particular wafer. This requires the initial creation of artwork from which the mask is formed by a photoreproductive process. If performed manually this technique is laborious, time-consuming and subject to human error. If performed with design automation apparatus there is involved a heavy initial investment in the design and construction of the equipment. Furthermore, once the mask is used to expose the photoresist coating on the particular wafer for which the mask was created, the mask is then useless and the large expense involved in its fabrication is allocated to a single wafer so as to greatly increase the cost of manufacture of the latter.

The other technique of the prior art is to expose the photoresist coating on the wafer with a light beam so as to form a wiring interconnection pattern by relative displacement of the light beam and the wafer. Due to the literally microscopic dimensions involved in the interconnection pattern it is extremely difficult to provide relative displacement of the light beam and the wafer with sufficient accuracy and precision. This is because the mechanical devices for displacing the wafer or the light beam inherently involve inaccuracies due to backlash, wear, and manufacturing tolerances in the screw threads, gears and other engaging parts.

These deviations in the mechanism provide relatively large inaccuracies in the locus traced by the light beam because of the lack of deamplification in the conversion of mechanical movement to optical displacement. That is, the displacement of a mechanical part a given distance results in an approximately equal displacement of the light beam. Hence, the errors and inaccuracies of the light beam locus are of the same order of magnitude as those of the mechanical parts and it is difficult to maintain the high degree of precision required for the microscopic dimensions of the wiring pattern of a monolithic integrated circuit.

These disadvantages of the prior art are obviated in the present invention by a novel apparatus for exposing the photoresist coating on the semiconductor wafer so as to form thereon the metallic interconnection pattern which wires up the various network components to form a single circuit. In the preferred embodiment of the invention disclosed herein for purposes of illustration, the light beam is transmitted through a refracting glass plate before it strikes the photoresist. A relatively large angular displacement of the glass plate provides, in accordance with Snell's law of refraction, a relatively small displacement of the light beam. This provides a large deamplification in the conversion of the movement of the mechanical parts to displacement of the light beam, and hence any errors and inaccuracies in the mechanism result in much smaller deviations in the locus or path traced out by the light beam.

The angular displacements of the refracting plate may be controlled automatically in response to test data designating which network components are acceptable so as to determine the configuration of the wiring interconnection pattern to be traced out by the light beam. In the preferred embodiment disclosed herein the test apparatus applies probes in succession to the various network components on the wafers so that electrical test signals may be applied thereto. The responses of the network components are evaluated by a digital computer and then the resulting data is printed out in the form of punched paper tape. The latter is then fed to a tape reader constituting an input for a second computer having stored in its memory programmed information as to the circuit to be formed on the particular wafer. The second computer then processes the test data along with the circuit information and determines an individual wiring interconnection pattern which is to be formed on that particular wafer. To realize this pattern the computer generates digital instructions which are converted to analog drive signals by a digital-to-analog converter. These analog drive signals are then transmitted to servomotors which angularly displace the refracting glass plate with the required sequential movements so as to cause the light beam to trace out the required locus on the photoresist coating of the wafer. The exposed photoresist is then developed and a metallic wiring interconnection pattern is formed in conformity therewith by etching, evaporation or other conventional technique. Alternatively, the wiring pattern may be formed by diffused conductive regions in the wafer.

It is therefore a primary object of the present invention to provide a novel technique for exposing a photoresist coating on a workpiece by moving a light beam thereover in a precisely dimensioned locus and having the advantages set forth above.

An equally important object is the utilization of said exposing technique to provide an improved method for the manufacture of monolithic integrated circuits with greater economy, yield, speed and accuracy than heretofore.

Instead of utilizing the subject exposing apparatus to expose the wafer directly as in the preferred embodiment disclosed herein, it may be used to expose a photographic film to provide artwork from which a mask may be made. The mask may then be applied to the wafer to expose the latter. This mask making technique may be utilized with either the above-described discretionary wiring approach or with a fixed wiring interconnection pattern suitable for small-scale integration or high-yield wafers.

Other objects and advantages of the present invention are either inherent in the specific embodiments of apparatus and methods disclosed herein or will become apparent to those skilled in the art as the detailed description proceeds in connection with the accompanying drawings wherein.

Figure 7:
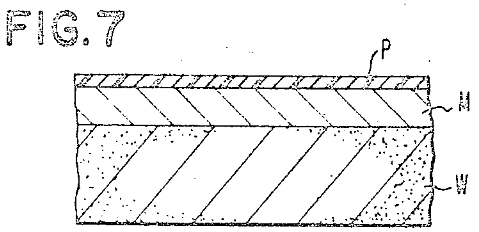
Figure 8:
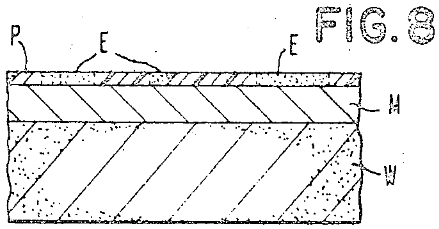
Figure 9:
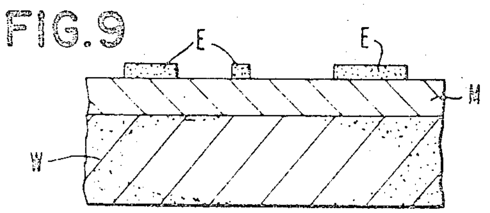
Figure 10:
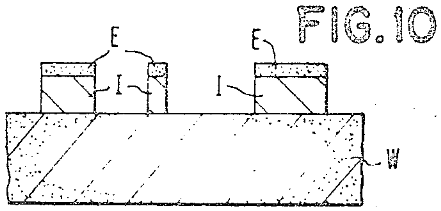
Figure 11:
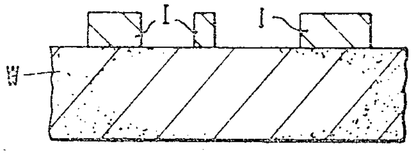
Figure 6:
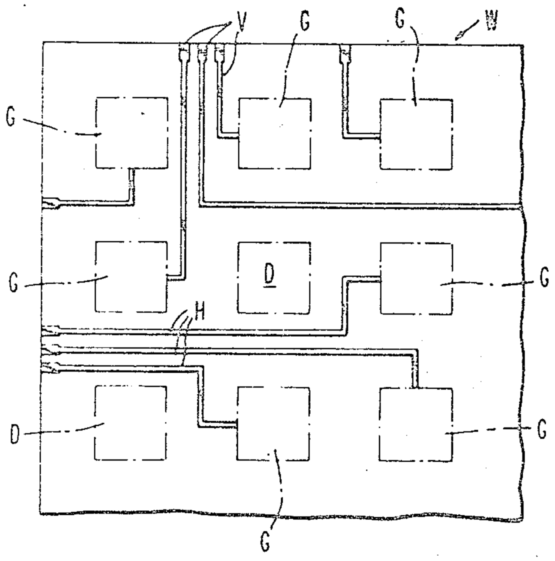
Figure 12:
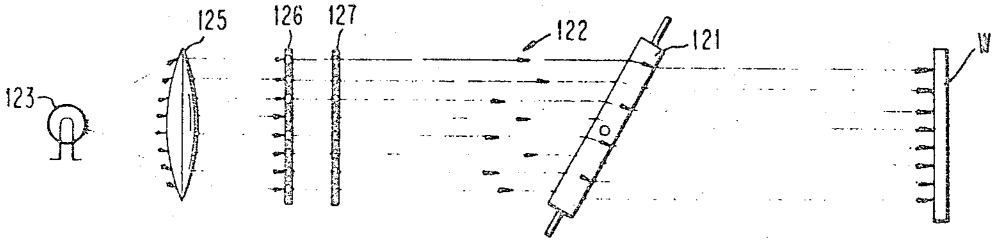

FIG. 6 in an enlarged schematic view of a portion of a monolithic circuit wafer showing the wiring interconnection pattern connected to the acceptable circuit components;

FIG. 7 is a schematic cross sectional view of a portion of a wafer or other workpiece having a metallic layer and a photoresist coating thereon, FIG. 8 shows the latent image formed in the photoresist after the wafer of FIG. 7 is exposed, FIG. 9 shows the wafer after the exposed photoresist has been developed and the unexposed portions thereof removed, FIG. 10 shows the wafer after the etching step has removed those portions of the metallic layer not protected by the developed photoresist;

FIG. 11 shows the wafer after the photoresist has been washed away leaving the metallic interconnection wiring pattern; and FIG. 12 is a schematic view showing the use of a modified light source emitting a plurality of collimated light beams for tracing simultaneously a plurality of identical latent images on a single wafer.

Figures 1, 2:
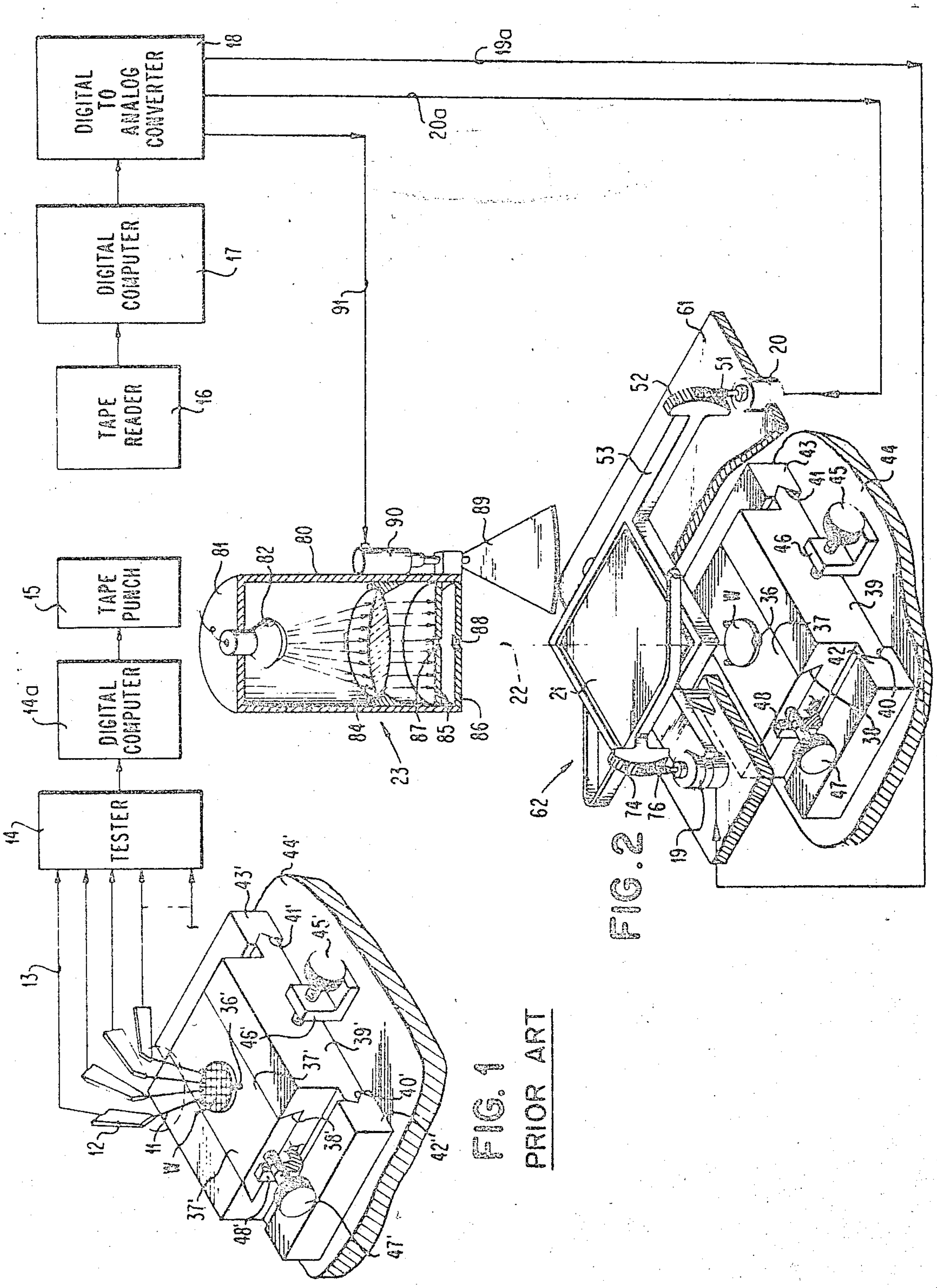
FIG. 1 PRIOR ART, FIG. 2
FIG. 1 is a schematic view of a conventional system for testing the components of the masterslice pattern formed in a monolithic integrated circuit wafer.
FIG. 2 is a schematic view of the system in accordance with the present invention for exposing the photoresist coating on the wafer so as to form a wiring interconnection pattern.

Referring now to the drawings in more detail, and first to FIG. 1, there is shown a conventional system for testing the various circuit elements or other components of the master-slice pattern formed in a monolithic integrated circuit wafer so as to determine which of the components are acceptable and which are defective. The wafer is indicated by the reference letter W and is mounted by an arrangement including structural elements 36' to 48' inclusive and described in the below description of FIG. 2 wherein corresponding elements have applied thereto the same reference numerals without the prime symbol. The test nodes on the wafer surface are contacted by the respective feeler elements 11 of a plurality of test probes 12 connected by leads 13 to a tester apparatus 14. The latter generates input test signals which are applied to the input nodes of the wafer components and receives the response signals from the output and other nodes thereof. The response signals are evaluated by a digital computer 14a which determines which of the wafer components are acceptable. This data may then be recorded by a tape punch 15 so as to create a paper tape constituting a record of those wafer components which may be utilized in the final inter-connected network to be formed on the wafer W.

Referring now to FIG. 2 there is shown the novel apparatus for exposing the photoresist coating on the wafer W so as to form thereon a wiring interconnection pattern. The apparatus comprises a tape reader 16 for reading the test data from the paper tape formed by tape punch 15. The data is then fed to a digital computer 17 which is provided with a design automation program including information as to the circuits and networks to be formed on the wafer W. Computer 17 analyzes the test data in conjunction with the circuit or network information and then determines a wiring pattern to interconnect the acceptable components.

Computer 17 accordingly generates digital instructions which are fed to a digital-to-analog converter 18 which converts these digital instructions into analog drive signals transmitted through leads 19a,20a to servomotors 19,20 respectively. The latter angularly displace a glass plate 21 which refracts a light beam 22 radiated from a light source 23 so as to move the light beam 22 over the photoresist coating on the upper surface of wafer W and thereby expose the required interconnection pattern on the latter.

The details of tape reader 16, digital computer 17 and the design automation program therefor, and digital-to-analog converter 18 are not disclosed herein because they are well known in the art and form no part of the present invention. However, the apparatus for moving light beam 22 with respect to wafer W is believed to be novel and the details thereof will now be described.

The wafer W is aligned by pins 36 attached to the upper surface of a first slide member 37 slideably mounted within a dovetail slot 38 formed in a second slide member 39 which is in turn slideably mounted within oppositely facing V-shaped grooves 40,41 formed in a pair of support members 42,43 secured to the upper surface of a base plate 44. First slide member 37 is moveable in a direction orthogonal to the direction of movement of second slide member 39. The position of the latter is adjusted by a manually adjustable screw 45 threaded within a bracket 46 secured to base plate 44, and the position of first slide member 37 is similarly adjusted by a screw 47 threaded within a bracket 28 secured to second slide member 39. The position of wafer W may thus be precisely determined.

Figure 3:
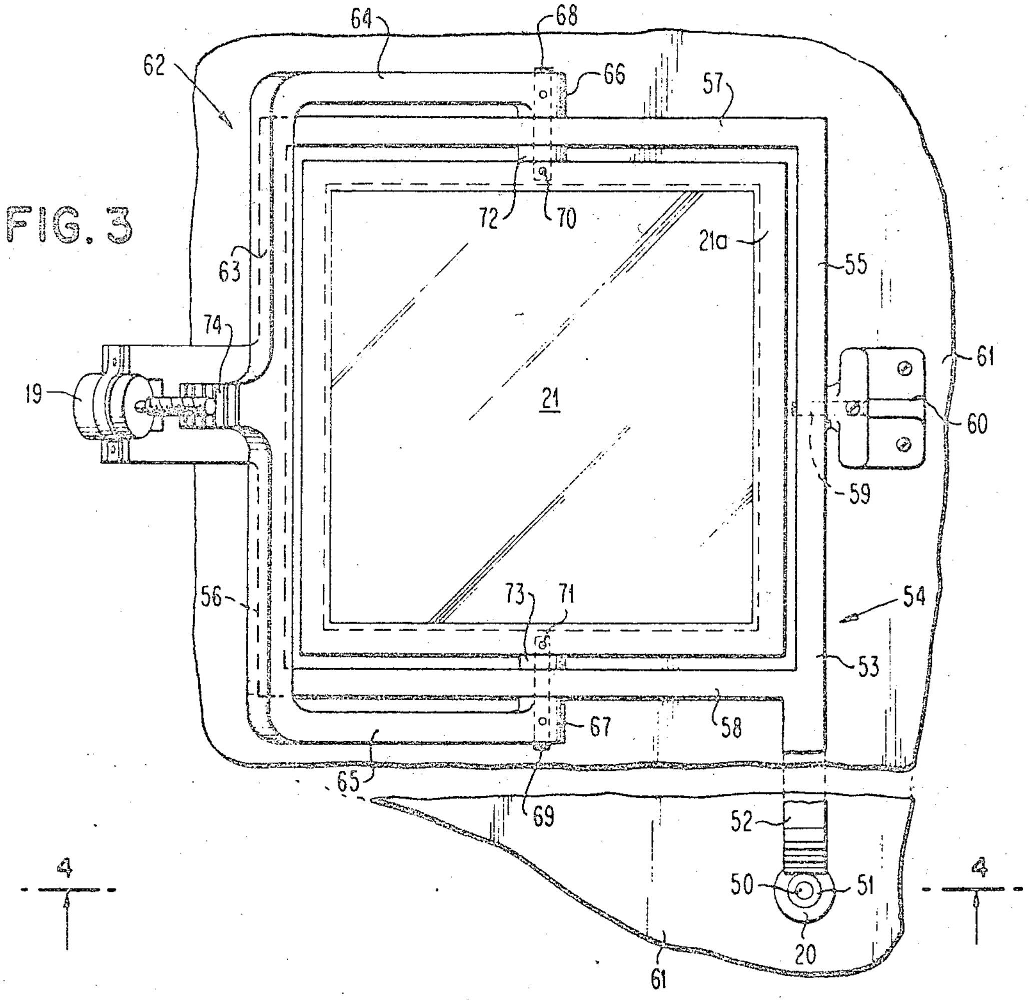
FIG. 3 is a top plan view of the support for moveably mounting the glass refracting plate which deflects the light beam.
Figure 4:
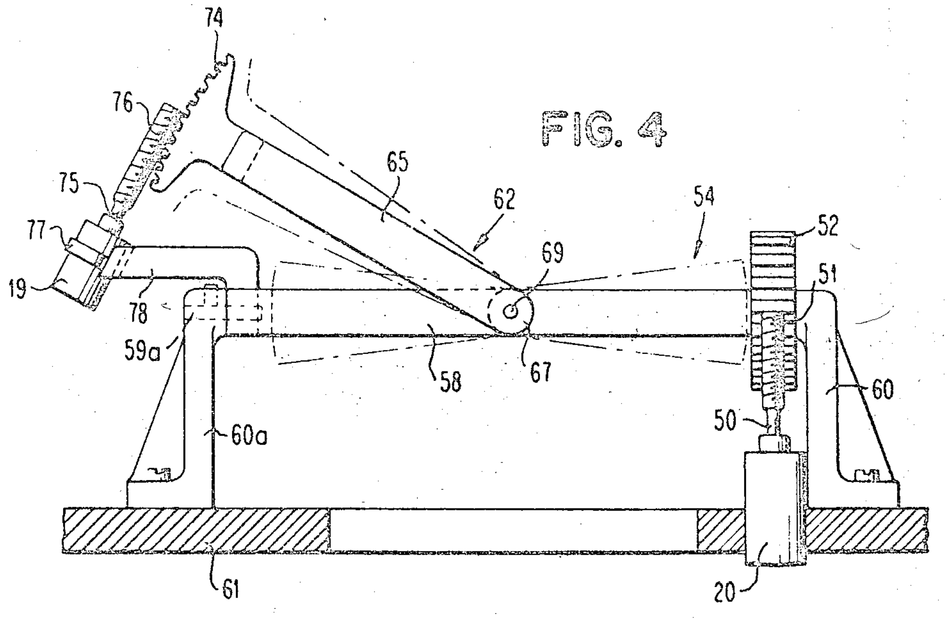
FIG. 4 is a vertical section view taken substantially on lines 4--4 of FIG. 3.

As shown in FIGS. 2 to 4, servomotor 20 has an output shaft 50 to which is secured a worm gear 51 engaging an arcuate gear segment 52. The latter is secured to the outer end of an arm 53 having its inner end formed integral with a rectangular frame indicated generally by the reference numeral 54. The latter comprises a pair of parallel frame elements 55,56 interconnected at their ends by transversely extending frame elements 57,58. Frame 54 is mounted for angular displacement about the axis of a pair of coaxially aligned pivot pins 59,59a secured to the upper ends of a pair of respective brackets 60,60a attached to the upper surface of a support plate 61.

The reference numeral 62 indicates generally a yoke comprising an intermediate portion 63 having integrally formed at its opposite ends of pair of transversely extending arms 64,65 each having at the outer end thereof a bearing 66,67 within which is secured a pivot pin 68,69 rotatably mounted within suitable bearing openings formed in the respective frame elements 57,58. The inner ends of pivot pins 68,69 are secured by cotter pins 70,71 to a rectangular frame support 21a extending peripherally around and secured to the marginal edges of the glass plate 21. A pair of spacer washers 72,73 surround pins 68,69 between respective frame elements 57,58 and the glass support 21a. The latter together with glass plate 21 and yoke 62 are thus mounted for angular displacement about the common axis of bearing pins 68, 69.

The angular position of this assembly is controlled by servomotor 19 having an output shaft 75 formed with a worm gear 76 engaging an arcuate gear segment 74 attached to the intermediate portion 63 of yoke 62. Servomotor 19 is secured by a strap 77 to a support 78 attached to the upper end of bracket 60a. Glass plate 21 may thus be angularly displaced about the orthogonal axes of the pivot pin pairs 59,59a and 68,69.

Light source 23 is shown schematically in FIG. 2 and comprises a cylindrical housing 80 having a top cover 81 mounting a light bulb 82. Light from the latter is collimated to form a narrow light beam 22 by a condenser 84 and a pair of aperture plates 85,86 having a pair of coaxially aligned apertures 87,88 through which the light beam 22 is emitted. A shutter 89 is moveable either to a closed position blocking light beam 22 and preventing it from striking wafer W or to the open position shown in FIG. 2 whereby light beam 22 is permitted to expose the photoresist coating on wafer W. The movements of shutter 89 are effected by a servomotor 90 controlled by computer 17 and actuated by analog signals from converter 18 connected to servomotor 90 by a line 91.

Figure 5:
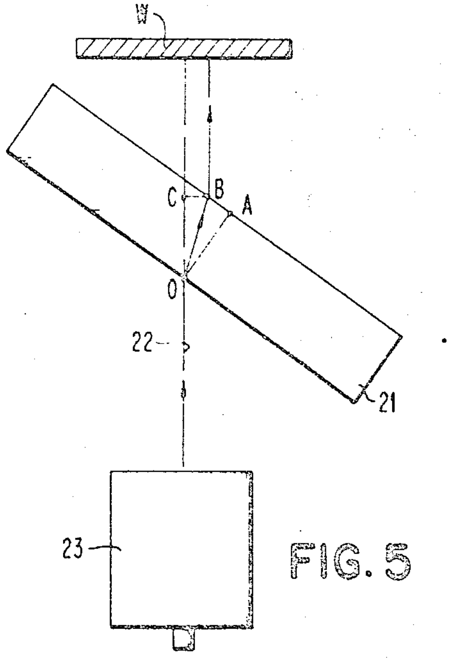
FIG. 5 is a schematic view of the geometrical optics involved in the application of Snell's law of refraction to the subject invention.

FIG. 5 shows the geometrical optics involved in the operation of displacing light beam 22 by angular movements of refracting glass plate 21. For a constant plate thickness and refractive index, tilting of plate 21 in a plane normal to light beam 22 causes the refracted beam to be displaced from the position it would have if plate 21 were normal to the ray. For example, in a 1" thick plate of transparent material with a refractive index of 1.5, as in the case of silica and mercury light at about 3500 Å should be $A + 20\Delta$, the displacement of light beam 22 is approximately 0.006" per degree of tilting of plate 21. This sensitivity is directly proportional to the thickness of plate 21, and is little changed by a variation in refractive index.

A displacement of up to 0.150" can be obtained for tilt angles of 25° or less, angles at which loss of light intensity by reflection is small, and which in any case could be compensated for by the addition of anti-reflection coatings to plate 21. It is further estimated that light beams as small as 0.0001" in diameter can be collimated without introduction of interference effects. This diameter is 8 times the wavelength of the light. Both this diameter and the scan dimensions are those presently envisaged as being used in fully integrated circuitry. It is further estimated that the rotation or tilting of plate 21 in both the X and Y directions can be controlled to between 0.1° to 0.01°, possibly permitting a line width of 0.0001″ located with a location accuracy of between 0.0006″ to 0.00006″.

Simple mechanical translation of the whole system can be used to move it from one set of interconnections to the next, when it has reached its maximum throw by tilting. This maximum throw, is, of course, related inversely to the thickness of plate 21, and thus inversely to the sensitivity, and directly to the loss of intensity due to reflection tolerable at high angles of incidence.

The sensitivity may be calculated as follows, where the dimensions shown in FIG. 5 are defined to be:

OA = thickness of plate
BC = translation of beam
angle AOC = angle of incidence = $i$
angle AOB = angle of refraction = $r$
$\mu$ = refractive index Now $$\frac{OA}{OB}=\cos r \therefore OA=OB\cos r$$

$$\therefore OB=\frac{OA}{\cos r}$$

and $$\frac{BC}{OB}=\sin(i-r)\therefore BC=OB\sin(i-r)=\frac{OA}{\cos r}\cdot\sin(i-r)$$

$$\therefore BC=\frac{OA}{\cos r}(\sin i\cdot\cos r-\sin r\cdot\cos i)$$

From Snell's law, $$\frac{\sin i}{\sin r}=\mu$$

$$\therefore \sin r=\frac{\sin i}{\mu}$$

and since $$\cos^2 r=1-\sin^2 r\therefore \cos r=\sqrt{1-\sin^2 r}$$

$$\therefore BC=\frac{OA}{\sqrt{1-\frac{\sin^2 i}{\mu^2}}}\left(\sin i\sqrt{1-\frac{\sin^2 i}{\mu^2}}-\frac{\sin i\cos i}{\mu}\right)$$

$$BC=OA\left(\sin i-\frac{\sin i-\cos i}{\sqrt{\mu^2-\sin^2 i}}\right)$$

Plotting BC, the movement of the light spot, against values of i, the angle of incidence for values of 5°, 10°, 15°, 20°, and 25°, keeping OA=1″ and $\mu$=1.5 there is obtained.

| i= | 5° | 10° | 15° | 20° | 25° |
|---|---|---|---|---|---|
| BC= | .029″ | .060″ | .090″ | .122″ | .159″ |

Therefore the sensitivity under these conditions is approximately 0.006″/degree of rotation.

FIG. 6 shows schematically an enlarged view of a portion of a typical monolithic circuit wafer W. The curcuits are located within the square areas designated by the dashed lines, those circuits having been found "good" or acceptable being designated by the reference letter G and those having been found defective being designated by the reference letter D. The acceptable circuits G are shown interconnected by a metallic wiring pattern comprising vertical metallic conductive strips V and horizontal strips H. The defective circuits D are not used and the wiring interconnection strips V, H are not interconnected therewith so that the defective circuits D are omitted from the final network formed on wafer W.

A preferred method of forming the metallic wiring interconnection pattern will now be described with reference to FIGS. 7 to 11 inclusive. The wafer W, usually in the form of a monolithic silicon block, is provided with a metallic layer M over which is superimposed a photoresist coating P. After the exposure step by the apparatus described above, there is formed in photoresist coating P a latent image comprising exposed areas E as shown in FIG. 8. Photoresist coating P is then developed and the unexposed portions of coating P are removed to leave the exposed portions E as shown in FIG. 9. An etchant, such as hydrochloric acid, is then applied so as to etch away and remove those portions of metallic layer M which are not protected by the exposed remaining portions E of photoresist coating P, thereby leaving metallic strips forming the interconnection pattern I as shown in FIG. 10. The exposed developed photoresist portions E are then removed to leave the interconnection pattern I upon the upper surface of wafer W as shown in FIG. 11.

In FIG. 12 there is shown schematically an arrangement for exposing simultaneously a plurality of intraconnection patterns to form a plurality of identical circuit elements which may then be interconnected in the manner described above and shown in FIG. 6. A light source 123, condenser 125 and aperture plates 126, 127 form a plurality of parallel light beams 122 which are refracted and displaced by a glass plate 21 so as to expose simultaneously a plurality of identical patterns on the wafer W. Plate 121 may be angularly displaced about orthogonal axes by the apparatus described above with respect to FIGS. 2 to 4 inclusive.

As shown by the calculation above, the movement of a light beam is related only to the angle of the glass refracting plate relative to the incident beam and not to the position of the latter. Thus the plurality of collimated beams 122 are refracted and displaced by identical amounts in response to the angular displacement of plate 121.

While the invention has been particularly shown and described with reference to several preferred embodiments thereof, it will be understood by those skilled in the art that the foregoing and other changes in form and details may be made therein without departing from the spirit and scope of the invention.

I claim:

1. An apparatus for exposing a workpiece having a photoresist coating thereon and comprising:
   - a workpiece holder for aligning and maintaining the workpiece in a predetermined position,
   - a light source for radiating a light beam to the photoresist coating of the workpiece,
   - a light deflecting member to deflect the light beam in response to movement of the member said light deflecting member comprising a refracting element through which the light beam is transmitted in its path from the light source to the workpiece,
   - a support for movably mounting the light deflecting member,
   - an actuating device operable to move the light deflecting member, and
   - a control system for directing the operation of the actuating device to move the light deflecting member with a predetermined displacement and thereby deflect the light beam to expose a desired pattern on the photoresist coating.

2. An exposing apparatus as recited in Claim 1, wherein said refracting element comprises a transparent glass plate having substantially parallel planar opposite surfaces and angularly inclined with respect to the light beam.

3. An apparatus as recited in Claim 1, wherein said light source comprises means for collimating said light beam.

4. An exposing apparatus as recited in Claim 1, wherein said light source comprises means for radiating a plurality of parallel light beams for the simultaneous exposure of a plurality of identical patterns on the photoresist coating of the workpiece.

5. An apparatus as recited in Claim 1, wherein said support for movably mounting the light deflecting member comprises means for mounting the member for angular displacement about a first axis of rotation and means for mounting the member for angular displacement about a second axis of rotation substantially orthogonal to said first axis.

6. An apparatus for exposing a workpiece having a photoresist coating thereon and comprising:

a workpiece holder for aligning and maintaining the workpiece in a predetermined position, a light source for radiating a light beam to the photoresist coating of the workpiece, a light deflecting member to deflect the light beam in response to movement of the member, a support for movably mounting the light deflecting member, an actuating device operable to move the light deflecting member, and a control system for directing the operation of the actuating device to move the light deflecting member with a predetermined displacement and thereby deflect the light beam to expose a desired pattern on the photoresist coating, said control system comprising an input device for receiving data as to the characteristics of the workpiece, a memory device for storing information as to the circuit pattern configuration to be exposed on the workpiece photoresist coating, and a control means for directing the operation of said actuating device in response to both said data and said information.

7. An exposing apparatus as recited in Claim 6, wherein said control means comprises a digital computer for analyzing said data and said information and for formulating digital instructions in response thereto;

a digital to analog converter for converting said digital instructions into analog drive signals, and said actuating device comprising motor-driven means energizeable by said analog drive signals.

8. An apparatus for exposing a workpiece having a photoresist coating thereon and comprising:

a workpiece holder for aligning and maintaining the workpiece in a predetermined position, a light source for radiating a light beam to the photoresist coating of the workpiece, a light deflecting member to deflect the light beam in response to movement of the member, a support for movably mounting the light deflecting member, an actuating device operable to move the light deflecting member, a control system for directing the operation of the actuating device to move the light deflecting member with a predetermined displacement and thereby deflect the light beam to expose a desired pattern on the photoresist coating, and a testing apparatus for preliminarily inspecting the workpiece to be exposed and for generating data as to the characteristics of the specific workpiece, said control system including means for receiving said data and for directing the operation of the actuating device in response to said data.

9. An apparatus for exposing a monolithic circuit wafer having a photoresist coating thereon and comprising:

a wafer holder for aligning and maintaining the wafer in a predetermined position, a light source for radiating a light beam to the photoresist coating of the wafer, a light deflecting member to deflect the light beam in response to movement of the member, said light deflecting member comprising a refracting element through which the light beam is transmitted in its path from the light source to the wafer, a support for movably mounting the light deflecting member, and an actuating device operable to move the light deflecting member.

10. An exposing apparatus as recited in Claim 9 wherein said refracting element comprises a transparent glass plate having substantially parallel planar opposite surfaces and angularly inclined with respect to the light beam.

11. An exposing apparatus as recited in Claim 9 wherein said light source comprises means for radiating a plurality of parallel light beams for the simultaneous exposure of a plurality of identical circuit interconnection patterns on the photoresist coating of the wafer.

12. An apparatus as recited in Claim 9 wherein said support for movably mounting the light deflecting member comprises means for mounting the member for angular displacement about a first axis of rotation and means for mounting the member for angular displacement about a second axis of rotation substantially orthogonal to said first axis.